United States Patent [19]
Forbes

[11] Patent Number: 6,037,883
[45] Date of Patent: Mar. 14, 2000

[54] EFFICIENT MEMORY USAGE FOR TWO-PASS COMPRESSION

[75] Inventor: Jonathan Forbes, Bellevue, Wash.

[73] Assignee: Microsoft Corporation, Redmond, Wash.

[21] Appl. No.: 09/073,893

[22] Filed: May 7, 1998

[51] Int. Cl.[7] .................................................. H03M 7/00
[52] U.S. Cl. ................................................................. 341/51
[58] Field of Search ................................ 341/51, 65, 50, 341/61

[56] References Cited

U.S. PATENT DOCUMENTS

| | | | |
|---|---|---|---|
| 4,302,775 | 11/1981 | Widergren et al. | 341/51 |
| 5,764,374 | 7/1998 | Seroussi et al. | 341/65 |

OTHER PUBLICATIONS

Nelson, Mark et al., "The Data Compression Book", 2nd Edition, M&T Books, New York, NY, 1996, Chapters 8–9, pp. 215–288.

*Primary Examiner*—Brian Young
*Attorney, Agent, or Firm*—Lee & Hayes, PLLC

[57] ABSTRACT

Described above is a two-pass method of compressing a data input stream to create a compressed data output stream. The method includes a step of sequentially examining data elements and strings of data elements of the data input stream in a first compression pass using a sliding window compression scheme to find literal data elements and pairs of length and displacement values. The first compression pass includes: coding the literal data elements and the length values with a first minimum redundancy coding tree; coding the displacement values with a second minimum redundancy coding tree; and adding the coded literal data elements, length values, and displacement values to a single data buffer. The method also includes a second compression pass that is performed whenever the single data buffer reaches a predefined capacity.

29 Claims, 5 Drawing Sheets

EFFICIENT MEMORY USAGE FOR TWO-PASS COMPRESSION

TECHNICAL FIELD

This invention relates to methods of compressing data streams using two compression passes, wherein the output of the first compression pass is buffered prior to the second compression pass.

BACKGROUND OF THE INVENTION

Although the amount of available digital in formation has mushroomed in recent years, limited data storage capacities and data communications bandwidths sometimes threaten the practicality of distributing this information. To deal with storage and bandwidth limitations, the use of some type of data compression has become almost universal.

Various data compression techniques are available , two of the more popular being, known as "zip" and "gzip". In accordance with these prior art techniques, a Compressed data stream consists of a series of output blocks corresponding to successive blocks of input data. Each input data block is compressed in two passes: a first pass using sliding window compression techniques, and a second pass using minimum redundancy coding techniques.

Sliding window compression involves sequentially examining data elements (also referred to herein as characters) and strings of data elements from a data input stream, and noting any strings that are repetitions of previously encountered identical strings. The term "sliding window" is used because the algorithm searches for previously encountered strings only within a "window" on the data input string, wherein the window includes only a defined number of data elements prior to the currently examined data element. The window moves as the algorithm progresses through the data input string.

When the algorithm encounters a string that matches a previously encountered string that is within the sliding window, the algorithm records two values: a length value and a displacement or distance value. The length value indicates the length of the matching string. The displacement value indicates the number of elements back in the input stream to the previously occurring string that the current string matches.

When the algorithm encounters a data element that is not part of a matching string, the algorithm records the value of the element itself. Such an element is referred to as a "literal" or "literal element."

Typically, the compressed data stream comprises literals with interspersed length/displacement pairs. A length element is always followed by a displacement element in the compressed data string.

A well-known example of sliding window compression is referred to as "LZ77".

Minimum redundancy coding, also referred to as Huffman coding or prefix coding, represents different data element values (from an a priori known stream of data elements) by codes (bit sequencesone code for each data element value. The codes are defined such that different values may be represented by bit sequences of different lengths, but such that a parser can always parse a coded string, unambiguously, value-by-value. The correspondence between codes and data element values is defined by what is referred to as a "coding tree." A coding tree is typically optimized for a specific set of data elements. To calculate an optimized coding tree, the data element set is analyzed to rank each possible element value according to its frequency of occurrence in the data set. Those values that occur most frequently are assigned codes with relatively short bit lengths, while less frequently occurring values are assigned longer codes.

In the public implementation of the GZIP compression method, sliding window compression is used in a first pass, with the compressed output being stored in two different buffers: one for literal and length values, and another for displacement values. Minimum redundancy coding is performed in a second compression pass performed on the two output buffers of the first pass. Storing the first pass output in two different buffers allows convenient statistical analysis of the respective output data in order to calculate two corresponding coding trees. One coding tree is calculated for use in coding the literal and length values, while another coding tree is calculated for use in coding the displacement values. The coding trees are recalculated for each block of data. Separate coding trees are used for the two buffers because the data elements of the two buffers are of different compositions: in the case of gzip, the displacement values are 16-bits in size, while 9 bits can fully specify literal or length values.

FIGS. 1–3 illustrate two-pass compression in accordance with the prior art, using a combination of sliding window compression and minimum redundancy coding. FIG. 1 illustrates a first compression pass which implements sliding window compression. FIG. I shows an input stream 10, a literal/length buffer 12. and a displacement buffer 14. Suppose that the compression algorithm has reached the character "$x_1$" in input stream 10 (processing from left to right), and that this character does not form part of a string that can be matched to any previous string. Since this character is not part of a matching string, it is written as a literal (Lit) to the literal/length buffer 12. An arrow in FIG. 1 indicates the process of writing $x_1$ to the next available location in literal/length buffer 12. To differentiate this 8-bit literal value from an 8-bit length value, a value of zero is stored in the next location in the displacement buffer, 14. Now suppose that the compression algorithm reaches the character "t" (indicated by reference numeral 15) that forms the first letter of the word or string "the", where the string "the" can be found in previously examined characters of the input string. FIG. 1 indicates the length of the string (three characters) and the displacement back to the most previous occurrence of the same string (six characters). In this case, the length value is written to the next available location in the literal/length buffer 12 and the non-zero displacement value is written to the next available location in the displacement buffer 14.

FIG. 2 illustrates a second compression pass, using minimum redundancy coding. The second pass takes place whenever either the literal length buffer 12 becomes full, or when displacement buffer 14 becomes full. In the second pass, 14 the contents of the two buffers 12 and 14 are Huffinan coded and merged into a single output stream 16. This involves first defining a coding tree optimized for the literal/length buffer 12 and another coding tree optimized for the displacement buffer 14. Then, the literal/length buffer and displacement buffer are read at the same time. A zero value in the displacement buffer indicates that a literal is present at the corresponding place in the literal buffer/length buffer, and a non-zero value in the displacement buffer indicating that a length value is present at said index. Each literal or length element is Huffman encoded, and the results are copied to output stream 16. Whenever a length value is written to the output stream 16, its corresponding non-zero displacement value is encoded after it in the stream. Most encoders do not write the displacement verbatim as a 16-bit value—rather the displacement is output as a Huffman-encoded slot number. Such a slot number specifies one of a plurality of value ranges (the value ranges can have different sizes). The slot number is followed by a second value (having a small number of bits) that pinpoints a specific value within the range indicated by the slot number. The slot number and the following second value will be generally referred to herein as a "slot-type" designation.

FIG. 3 shows the steps that are performed in producing compressed output stream 16 from input stream 10. A first step 30 comprises determining whether there is a string match at the next data element to be examined—whether the data element is the starting element of a string that has previously occurred. If the to result of this test is true, a step 32 is performed of writing the length of the string to the literal/length buffer 12 and the corresponding displacement value to the displacement buffer 14. Otherwise, if the result of step 30 is false, a step 34 is performed of writing a literal element to the literal/length buffer and writing a value of zero to the displacement buffer 14.

After either of these steps, a decision step 36 is performed, determining whether either of the two buffers (the literal/length buffer 12 or the displacement buffer 14) is full. If not, processing continues with the next data element in step 30. If a literal element has just been processed, the next element is the one immediately following the character just processed. If a matching string has just been processed, the next data element is the one following the matching string.

If one of the buffers has become full, a step 40 is performed of calculating a coding tree for the values in the literal/length buffer 12 and coding the buffer values with the calculated coding tree. A step 42 is performed of calculating a separate Huffinan coding tree for the values in the displacement buffer 14 and coding those buffer values with the calculated coding tree. A step 44 comprises compiling or concatenating the coded values and outputting them in compressed output stream 16. The Huffman coding trees themselves are also output as part of the compressed output stream 16, for subsequent use in decompression. The two buffers are cleared during step 44.

After step 44, the process continues back at step 30, with the next data element.

The description above is somewhat simplified, but is sufficient for understanding the characteristics of two-pass compression that are pertinent to the invention. Further details regarding compression techniques, including sliding window and minimum redundancy compression techniques, can be found in M. Nelson & J Gailly, *The Data Compression Book*, (2d ed. 1996), which is hereby incorporated by reference. In addition, specifications for the gzip and zip compression techniques can be found in Internet RFCs 1951 and 1952, which are also incorporated by reference.

Although the technique illustrated by FIGS. 1–3 is effective it is not very efficient with regard to its use of buffers. One inefficiency results from the fact that each literal occupies three bytes of storage (the 8-bit literal value itself, and the 16-bit displacement value of zero). Some prior art attempts to solve this problem by not storing a zero displacement value in the displacement buffer, and instead using a bitmap to indicate whether an entry in the literal/length buffer is an 8-bit match length or an 8-bit literal.

Another inefficiency results when one of the buffers fills up before the other buffer, so that the remaining space in the other buffer is not utilized. Although the displacement buffer is typically allocated with a smaller size than the literal/length buffer, it is impossible to size the buffers relative to each other so that they will fill up at the same time—since this depends on the characteristics of the data being compressed.

A further inefficiency results from the way data is stored in the buffers. Although displacements may be as large as the window size (up to 32767 in the case of gzip) almost displacements are significantly smaller, and therefore would benefit from a more compact encoding, rather than the reservation of the full 16 bits.

The inventor has found a way to make more efficient use of buffers when implementing a two-pass compression scheme.

SUMMARY OF THE INVENTION

In accordance with the invention, only a single buffer is used for storing literal values, length values, and displacement values. Furthermore, all of these values are coded using minimum redundancy coding before they are written to the buffers. An output block is generated only when the single buffer reaches its full capacity.

During the first-pass sliding window compression, any literal element is coded with a first Huffman coding tree and written to the single buffer. When a matching string is encountered, a length value coded with the first Huffman coding tree is written to the same single buffer. The corresponding displacement value is then coded with a second Huffman coding tree and appended to the buffer.

During the second pass, performed when the buffer becomes full, the buffer values are decoded and examined statistically to calculate a first optimized coding tree for the literal and length values, and a second optimized coding tree for the displacement values or their slot-type designations. The buffer values are then output into the data stream using these newly-optimized coding trees.

Subsequent steps in the first compression pass utilize the optimized coding trees calculated in the most recent second compression pass. This tends to optimize the buffer utilization, as the compressor adapts its storage encoding mechanism to the data.

The invention makes much more efficient use of available buffer memory than the prior art. Since only a single buffer is used, and since the second pass is performed only when this buffer becomes full, no buffer memory goes unused. Furthermore, since the values stored in the buffer are Huffinan coded, they are significantly smaller than the values used in the prior art.

DETAILED DESCRIPTION

Figure 1:
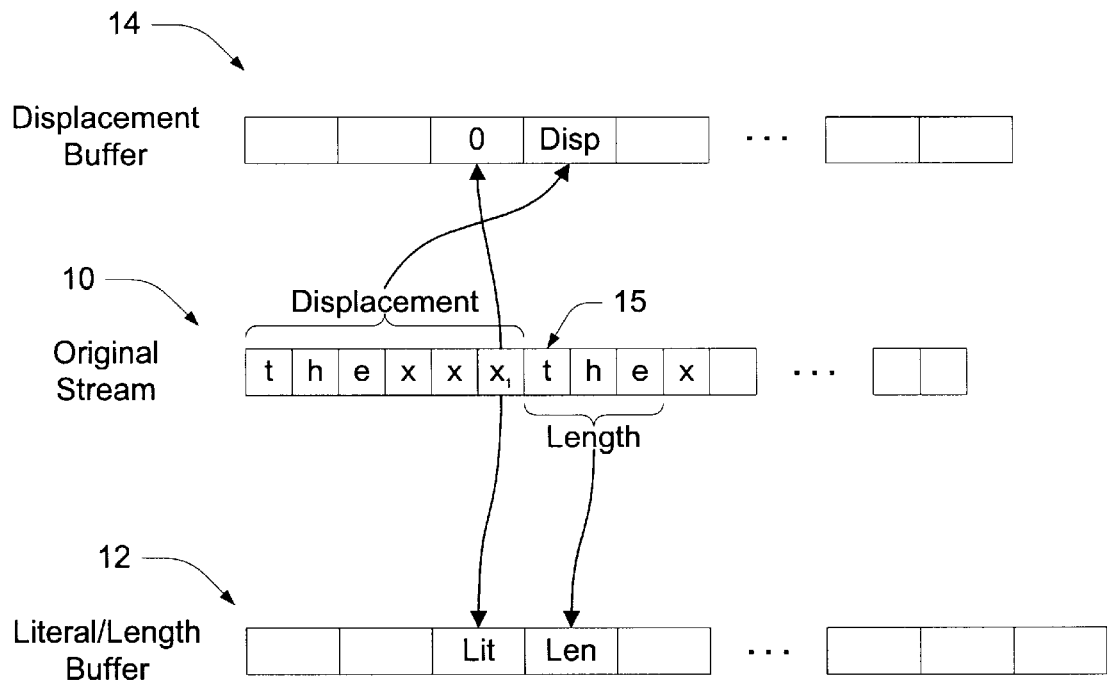
FIGS. 1 is a diagram that shows, conceptually, a first compression pass using sliding window compression in accordance with the prior art.
Figure 2:
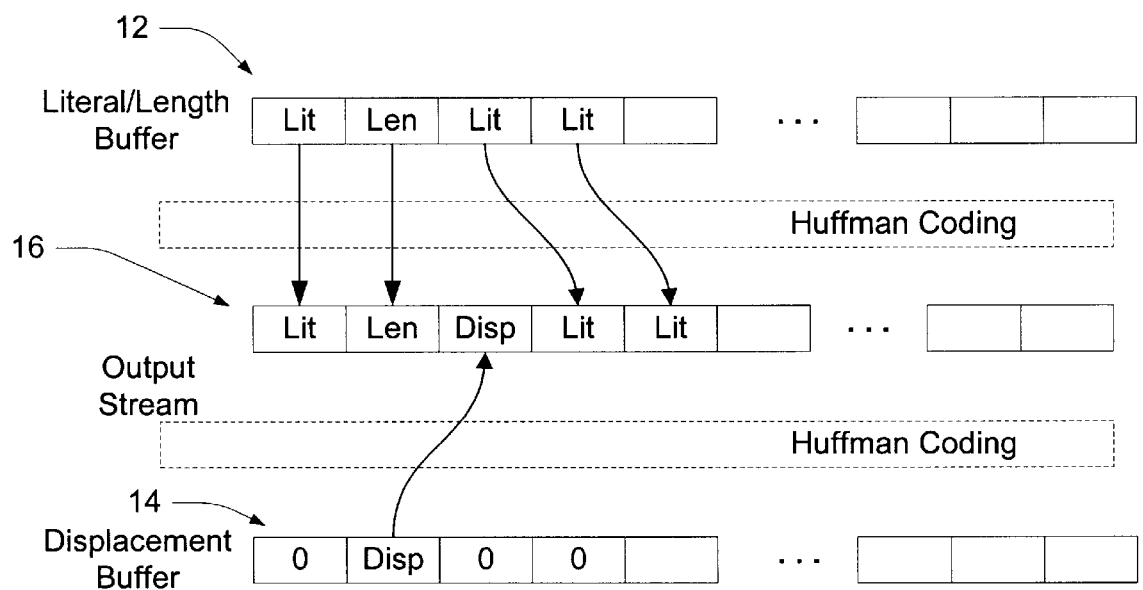
FIGS. 2 is a diagram that shows, conceptually, a second compression pass using sliding window compression in accordance with the prior art.
Figure 3:
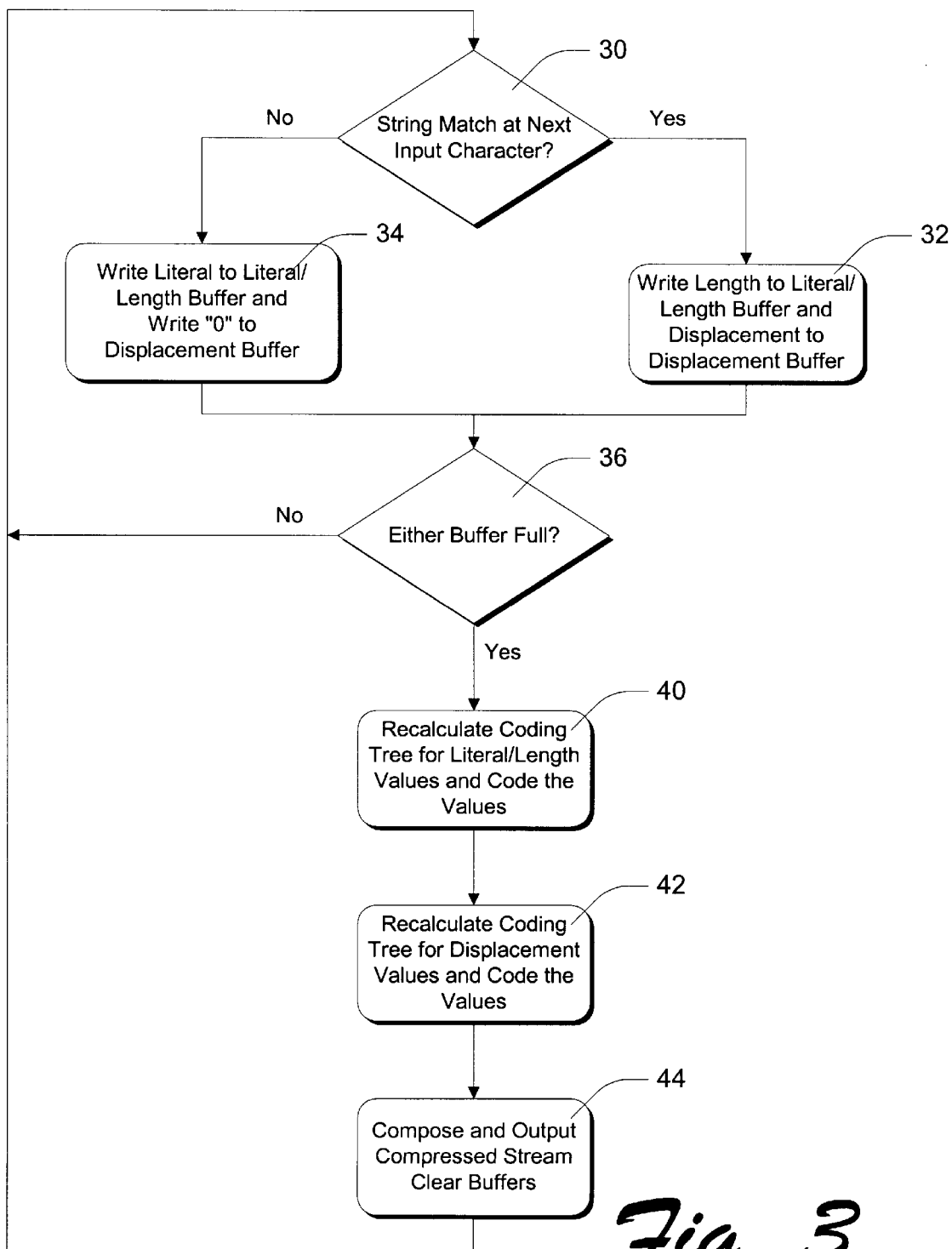
FIG. 3 is a flowchart showing prior art two-pass compression steps.
Figure 4:
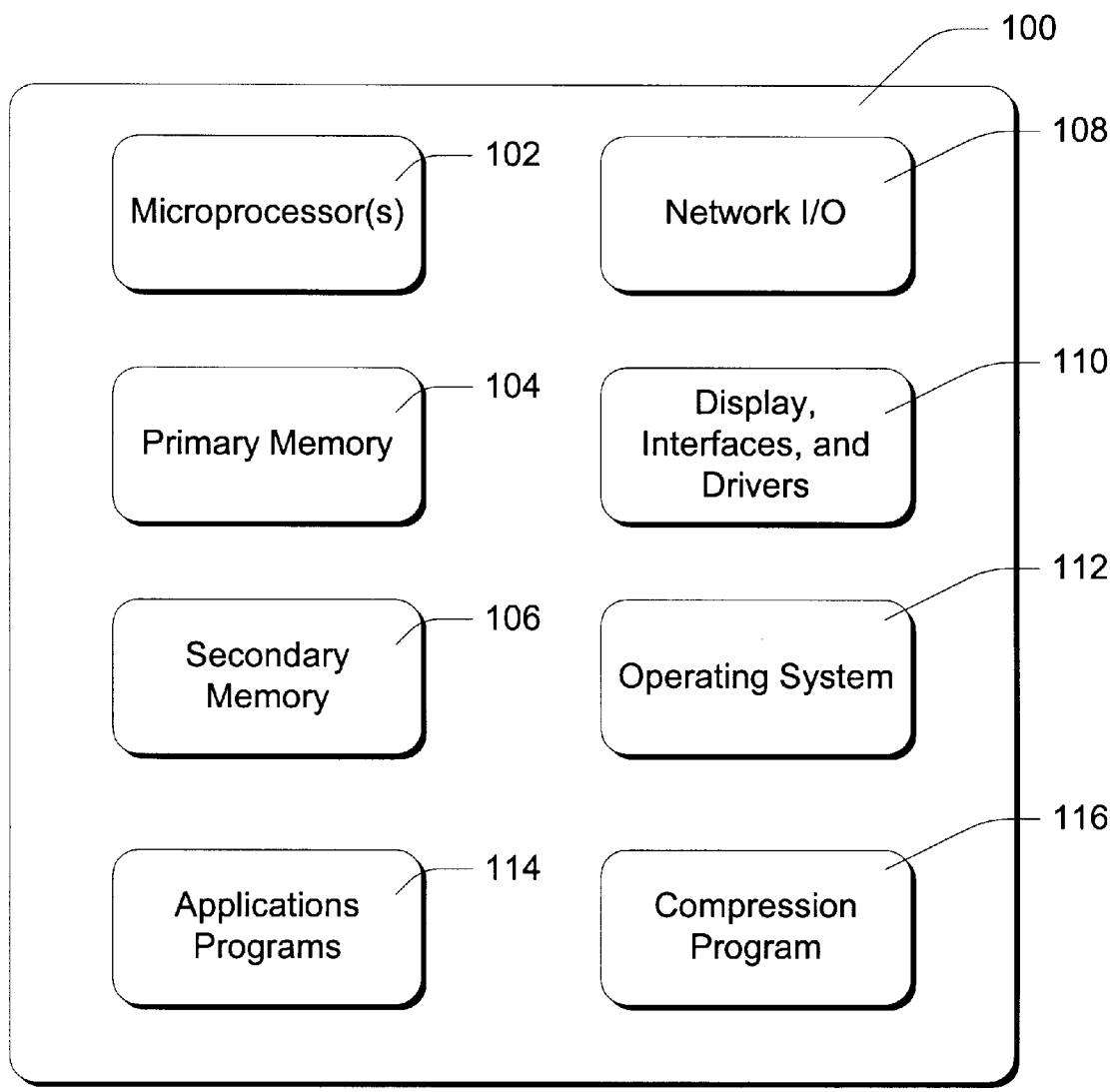
FIG. 4 is a block diagram showing a computer system in accordance with the invention.

FIG. 4 illustrates pertinent components of a computer system 100 in which the invention can be embodied. The computer system includes conventional components such as one or more data processors 102; volatile and non-volatile primary electronic memory 104; secondary memory 106 such as hard disks and floppy disks or other removable media: network interface components 108, display devices, interfaces, and drivers 110; and other components that are well known. The computer system runs a network operating system 112 such as the Windows NT operating system or some other Windows brand operating system. Computer system 100 and its operating system 112 are configured in accordance with known technology to communicate with other computers and information resources through the Internet or other network media.

The data processors 102 of computer system 100 are programmed by means of instructions stored at different times in the various computer-readable storage media of the computer. Application programs 114 and operating system 112 are typically distributed, for example, on floppy disks or CD-ROMs. From there, they are installed or loaded into the secondary memory of a computer. At execution, they are loaded at least partially into the computer's primary electronic memory. The invention described herein includes these and other various types of computer-readable storage media when such media contain instructions or programs for implementing the steps described below in conjunction with a microprocessor or other data processor. The invention also includes the computer system itself when programmed according to the methods and techniques described below.

For purposes of illustration, programs and other executable program components such as the operating system are shown in FIG. 4 as discrete blocks within a computer, although it is recognized that such programs and components reside at various times in different storage components of the computer, and are executed by the data processor(s) of the computer.

The invention includes a compression program 116 that uses two-pass compression techniques to produce a compressed output stream that is formatted in compliance with the gzip or zip standards. Compression program 116 is implemented either as a stand-alone program or as a set of utilities that are called by other application programs.

Figure 5:
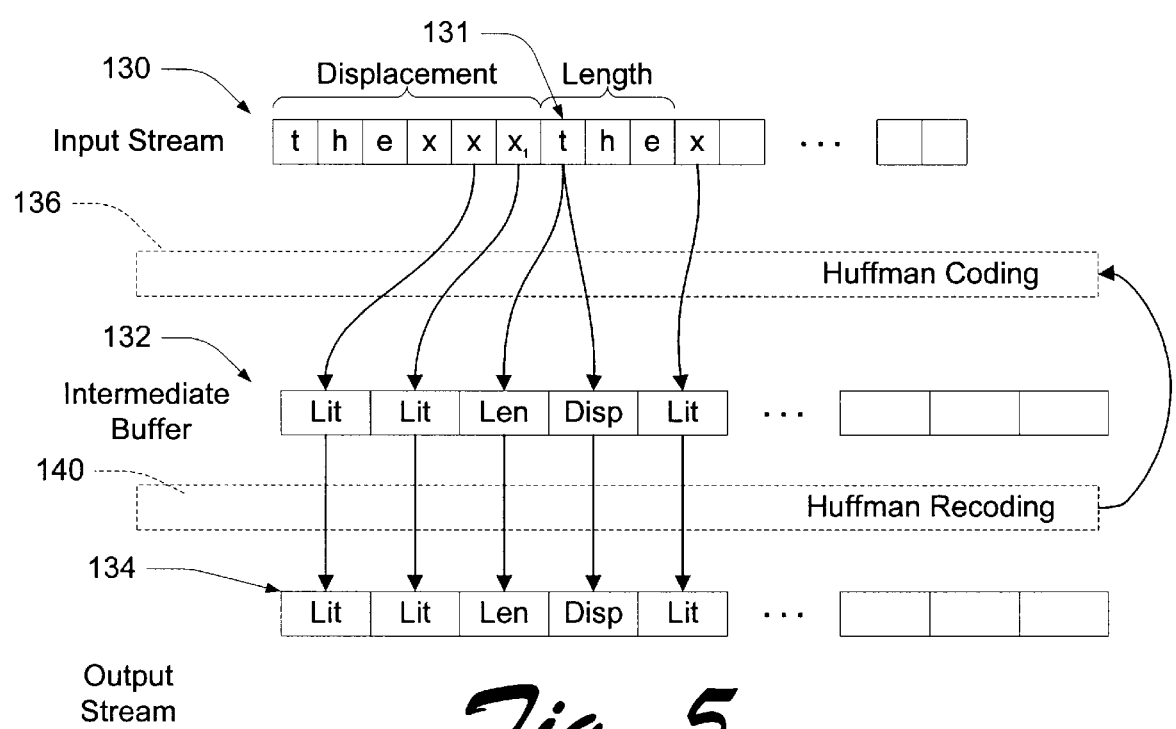
FIG. 5 is a diagram illustrating, conceptually, first and second compression passes in accordance with the invention.

FIG. 5 illustrates the functions of compression program 116 by way of a block diagram. The compression program receives an input data stream 130 and produces a compressed output stream 134. Intermediate results, after the first compression pass, are stored in a single intermediate buffer 132. Intermediate buffer 132 is preferably allocated from primary memory 104.

Assume again that data element $x_1$ of input stream 130 does not form part of a matching string, and is thus to be encoded as a literal character. In accordance with the invention, data element $x_1$ is coded using a form of minimum redundancy coding such as Huffman coding. Such coding is illustrated by way of a dashed block 136 through which the data element passes. The Huffman coding results in codes of variable lengths, which are packed into buffer 132 without respect for byte boundaries. Thus, $x_1$ is written to intermediate buffer 132 as a coded literal value, indicated by an arrow and the abbreviation "Lit$_1$" in FIG. 5.

After coding and writing $x_1$ to buffer 132, the "t" of string "the" (indicated by reference numeral 135) is processed. String "the" has a matching string in previously processed data, so that the entire string is to be recorded as a length/displacement pair. In accordance with the invention, the length value of string "the" (three in this example) is coded using Huffman coding 136 and then written to data buffer 132 as indicated by an arrow and by the abbreviation "Len" (the length value is first modified by adding a constant to it that is higher than the highest possible data element, to differentiate the length value from a literal value). Similarly, the displacement value (six in this case) is coded using Huffman coding 136 and then written to intermediate data buffer 132 following the corresponding length value. This step is indicated by an arrow and by the abbreviation "Disp" in intermediate buffer 132. Again, these coded values have variable lengths, and are packed into intermediate buffer 132 without respect for byte boundaries.

Huffman coding operation 136 utilizes two coding trees: a first coding tree for literal values and length values, and a second coding tree for displacement values. With regard to the first coding tree, there typically are 256 possible literal values and 256 possible length values. The literals are assigned 256 codes in the first coding tree, and the lengths are assigned another 256 codes in the first coding tree. Therefore the tree can be used to output one of 512 different codes, corresponding to any length or literal value.

When intermediate buffer 132 reaches a predefined capacity, it is flushed to compressed output stream 134. However, the individual elements are recoded again using minimum redundancy coding, before they are written to the output stream. This minimum redundancy coding operation, again comprising a form of Huffman coding, is indicated by dashed block 140. Before performing the actual recoding, optimized coding trees are constructed. That is, the values of buffer 132 are read, decoded, and tallied, and first and second coding trees are constructed based on the frequency of element values occurring in the buffer. The first coding tree is then used to recode the literal values and length values. The second coding tree is used to recode the displacement values. The recoded values are written to the output stream in the order that they occur in buffer 132. Further formatting is potentially performed in order to comply with specific compression specifications such as gzip or zip. For example, the first and second coding trees used by coding operation 140 are embedded in the output stream. In the actual embodiment of the invention, the displacement values are converted to and represented by slot-type designators as described above in the "Background" section of this document.

The scheme shown in FIG. 5 can be considered a multi-pass compression scheme. A first pass performs sliding window compression; performs temporary minimum redundancy recoding on the literal, length, and displacement values; and stores the resulting codes in buffer 132. A second pass recodes the values from buffer 132 using coding trees that are optimized for the data actually present in buffer 132, and writes the recoded data values to output stream 134.

Initially, the first coding operating 136 uses default coding trees that are not necessarily optimized for the actual input stream. After one iteration of the second compression pass, however, the first pass uses the coding trees calculated by the most recent second compression pass. This is indicated in FIG. 5 by a line from second Huffman coding block 140 to first Huffman coding block 136. In this way, it is possible to optimize the coding trees utilized in first Huffman coding block 136 without requiring an additional pass over the data.

Figure 6:
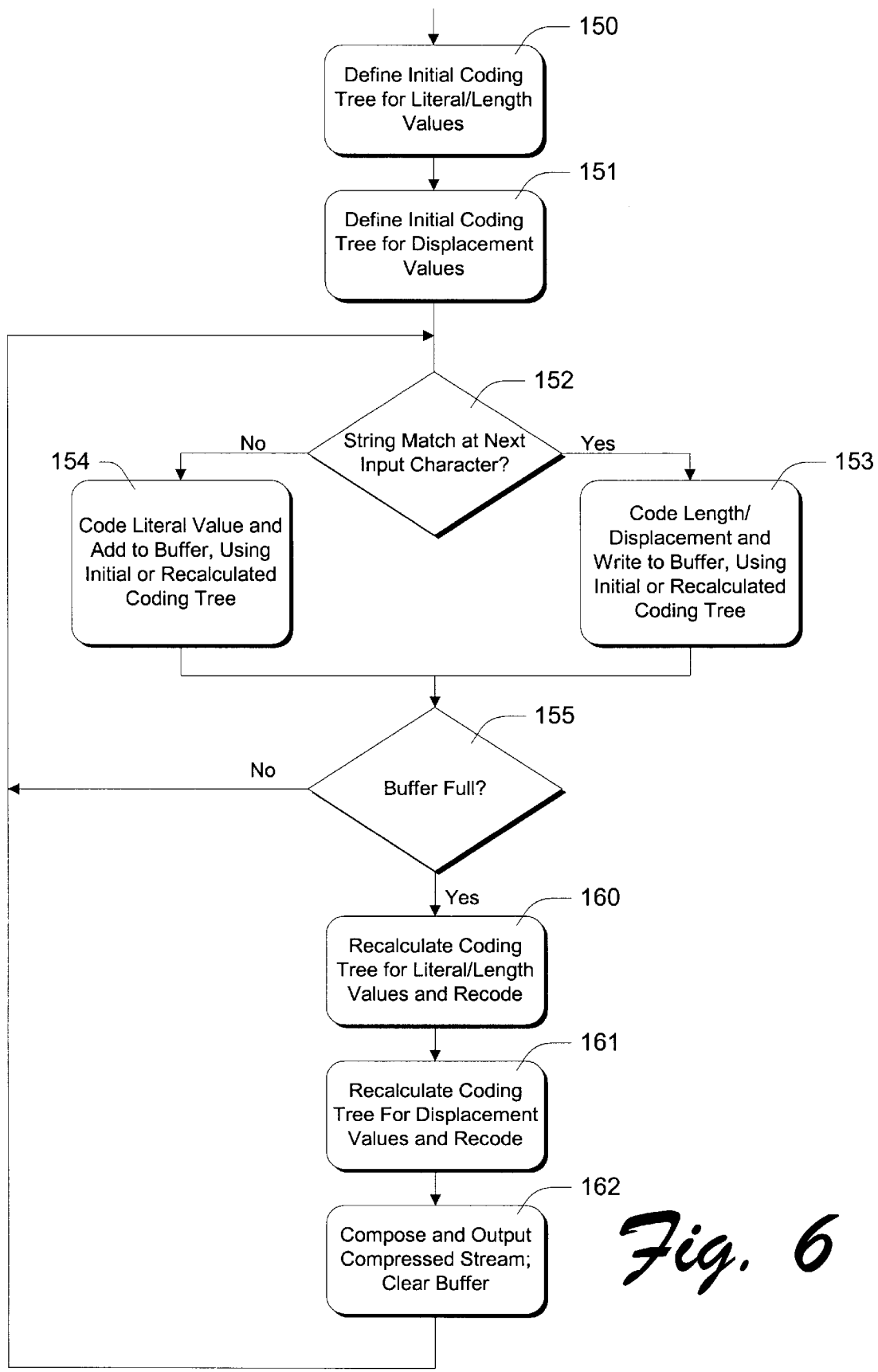
FIG. 6 is a flowchart showing preferred steps in accordance with the invention.

FIG. 6 illustrates an embodiment of the invention in methodological terms. Initial steps 150 and 151 comprise defining a default or initial Huffman coding tree for literal and length values (step 150), and another default or initial Huffman coding tree for displacement values or their slot-type representations(step 151). Steps 152–155 comprise a first compression pass that includes sequentially examining data elements and strings of data elements of the data input stream. The first compression pass uses a sliding window compression scheme to find literal data elements and pairs of length and displacement values. More specifically, step 152 comprises examining the next input character and determining whether it is the initial character of a string having a matching string in previously processed characters. If the character is the initial character of a matching string, a step 153 is performed with respect to the length and displacement values of the matching string. Step 153 includes coding the length value with a first minimum redundancy coding tree, coding the displacement value with the second minimum redundancy coding tree, and adding or appending these values to an intermediate buffer. If the character is not the initial character of a matching string, a step 154 is performed of recording the character as a literal element. Step 154 includes coding the literal value of the character using the first minimum redundancy coding tree and adding the coded value to the intermediate buffer.

As indicated by decision block 155, steps 152–154 are repeated until the intermediate buffer becomes full or reaches some predefined capacity, at which time a second compression pass is performed comprising steps 160–162. Each iteration of the second compression pass produces an output block of the compressed data string.

The second compression pass includes steps 160 and 161 of recalculating the first and second minimum redundancy coding trees based on the values represented in the intermediate data buffer. Specifically, this step involves decoding the values in intermediate buffer 132, tallying the values represented by the buffered codes, and creating coding trees based on the frequencies of occurring values (using standard Huffman coding techniques). Rather than tallying the values at this point, alternative embodiments might tally the values continuously as they are encountered during the first compression pass.

Steps 160 and 161 also comprise recoding the values stored in intermediate buffer 132. That is, the values are recoded in accordance with the newly calculated coding trees. After or in conjunction with this recoding, the values are written to an output stream in a step 162. Step 162 also includes other formatting and writing steps as necessary to comply with the specific overall format that is being used (such as gzip or zip). Step 162 also includes clearing the intermediate data buffer after the second compression pass, whereupon execution continues again with the first compression pass, at step 152. Note that after the second compression pass, the recalculated first and second coding trees are used in subsequent iterations of steps 153 and 154. Generally, after the initial iteration of the first compression pass, steps 153 and 154 use the most recently calculated minimum redundancy trees as calculated in steps 160 and 161.

The invention results in very efficient memory usage during two-pass compression operations. Specifically, the invention uses only a single intermediate buffer, which is utilized to its full capacity prior to each iteration of the second compression pass. This is a significant improvement over the prior art. Furthermore, coding the values before recording them in the intermediate buffer yields additional efficiency in buffer memory usage.

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

I claim:

1. A multi-pass method of compressing a data input stream to create a compressed data output stream, comprising the following steps:

sequentially examining data elements and strings of data elements of the data input stream in a first compression pass using a sliding window compression scheme to find literal data elements and pairs of length and displacement values;

when the first compression pass yields a literal data element adding the literal data element to a single data buffer;

when the first compression pass yields a pair of length and displacement values, adding the pair of length and displacement values to the single data buffer;

performing a second compression pass whenever the data buffer reaches a predefined capacity to produce an output block of the compressed data output stream, wherein the second compression pass uses minimum redundancy coding on the values in the single data buffer.

2. A multi-pass method as recited in claim 1, further comprising a step of clearing the single data buffer after each second compression pass.

3. A multi-pass method as recited in claim 1, wherein the second compression pass is performed using Huffman minimum redundancy coding.

4. A multi-pass method as recited in claim 1, wherein the second compression pass is performed using one or more minimum redundancy coding trees that are optimized for the values actually in the single data buffer when the second compression pass is performed.

5. A multi-pass method as recited in claim 1, wherein the second compression pass is performed using one or more Huffman minimum redundancy coding trees that are optimized for the values actually in the single data buffer when the second compression pass is performed.

6. A multi-pass method as recited in claim 1, wherein the first compression pass includes coding the literal data elements and the length and displacement values with one or more minimum redundancy coding trees, before adding the literal data elements and the length and displacement values to the single data buffer.

7. A multi-pass method as recited in claim 1, wherein the displacement values are represented by slot-type designations in the output block of the compressed data stream.

8. A multi-pass method as recited in claim 1, comprising a further step of converting the displacement values to slot-type designations in the second compression pass.

9. A multi-pass method as recited in claim 1, wherein the second compression pass is performed using one or more minimum redundancy coding trees that are optimized for the values actually in the single data buffer when the second compression pass is performed, wherein the first compression pass includes coding the literal data elements and the length and displacement values with the one or more minimum redundancy coding trees used in the most recent second compression pass, before adding the literal data elements and the length and displacement values to the single data buffer.

10. A computer programmed to perform steps as recited in claim 1.

11. A computer-readable storage medium comprising one or more data files compressed in accordance with the steps recited in claim 1.

12. A computer-readable storage medium having instructions that are executable to perform steps as recited in claim 1.

13. A multi-pass method of compressing a data input stream to create a compressed data output stream, comprising the following steps:

sequentially examining data elements and strings of data elements of the data input stream in a first compression pass using a sliding window compression scheme to find literal data elements and pairs of length and displacement values wherein the first compression pass includes: coding the literal data elements and the length values with a first minimum redundancy coding tree; coding the displacement values with a second minimum redundancy coding tree; and adding the coded literal data elements, length values, and displacement values to a single data buffer;

performing a second compression pass whenever the single data buffer reaches a predefined capacity to produce an output block of the compressed data output stream, wherein the second compression pass includes: recalculating the first and second minimum redundancy coding trees based on the values in the single data buffer; and recoding the literal data values, the length values, and the displacement values of the single data buffer using the recalculated first and second minimum redundancy coding trees;

clearing the single data buffer after each second compression pass;

subsequently using the recalculated first and second minimum redundancy coding trees in the first compression pass.

14. A multi-pass method as recited in claim 13, wherein first and second minimum redundancy coding trees are Huffman minimum redundancy coding trees.

15. A multi-pass method as recited in claim 13, wherein the displacement values are represented by slot-type designations in the output block of the compression stream.

16. A multi-pass method as recited in claim 13, comprising a further step of converting the displacement values to slot-type designations in the second compression pass.

17. A computer programmed to perform steps as recited in claim 13.

18. A computer-readable storage medium having instructions that are executable to perform steps as recited in claim 13.

19. A computer-readable storage medium comprising one or more data files compressed in accordance with the steps recited in claim 13.

20. A computer comprising:

a data buffer;

a compression component that performs at least first and second compression passes on an a data input stream to create a compressed data output stream;

wherein the first compression pass comprises (a) using a sliding window compression scheme to find literal data elements and pairs of length and displacement values, and (b) adding the literal data elements, length values, and displacement values to the data buffer;

wherein the second compression pass is performed whenever the data buffer reaches a predefined capacity to produce an output block of the compressed data output stream, wherein the second compression pass uses minimum redundancy coding on the values in the single data buffer.

21. A computer as recited in claim 20, wherein the first compression pass codes the literal data elements, length values, and displacement values using minimum redundancy coding.

22. A computer as recited in claim 20, wherein the first compression pass codes the literal data elements, length values, and displacement values using Huffman minimum redundancy coding.

23. A computer as recited in claim 20, wherein the first compression pass codes the literal data elements, length values, and displacement values with one or more minimum redundancy coding trees obtained from the most recently performed second compression pass.

24. A computer as recited in claim 20, the instructions being executable to perform a further step of converting the displacement values to slot-type designations in the second compression pass.

25. A computer-readable storage medium having instructions that are executable to perform at least first and second compression passes on a data input stream to create a compressed data output stream, wherein:

the first compression pass comprises (a) using a sliding window compression scheme to find literal data elements and pairs of length and displacement values; and (b) adding the literal data elements, length values, and displacement values to the data buffer;

the second compression pass is performed whenever the data buffer reaches a predefined capacity to produce an output block of the compressed data output stream, wherein the second compression pass codes the values in the single data buffer using one or more minimum redundancy coding trees that are based on the values in the single data buffer.

26. A computer-readable storage medium as recited in claim 25 wherein the first compression pass codes the literal data elements, length values, and displacement values using minimum redundancy coding.

27. A computer-readable storage medium as recited in claim 25 wherein the first compression pass codes the literal data elements, length values, and displacement values using Huffman minimum redundancy coding.

28. A computer-readable storage medium as recited in claim 25 wherein the first compression pass codes the literal data elements, length values, and displacement values with the one or more minimum redundancy coding trees obtained from the most recently performed second compression pass.

29. A computer-readable storage medium as recited in claim 25, the instructions being executable to perform a further step of converting the displacement values to slot-type designations in the second compression pass.

* * * * *